(12) United States Patent
Meng et al.

(10) Patent No.: US 9,846,182 B2
(45) Date of Patent: Dec. 19, 2017

(54) HIGH DI/DT CAPACITY MEASUREMENT HARDWARE

(71) Applicant: Infineon Technologies AG, Neubiberg (DE)

(72) Inventors: Pon Tiam Meng, Melaka (MY); Tai Chee Siew, Melaka (MY)

(73) Assignee: Infineon Technologies AG, Neubiberg (DE)

( * ) Notice: Subject to any disclaimer, the term of this patent is extended or adjusted under 35 U.S.C. 154(b) by 750 days.

(21) Appl. No.: 14/291,085

(22) Filed: May 30, 2014

(65) Prior Publication Data

US 2015/0346242 A1 Dec. 3, 2015

(51) Int. Cl.
 *G01R 19/00* (2006.01)
 *G01R 31/26* (2014.01)
 *G01R 31/40* (2014.01)

(52) U.S. Cl.
 CPC ..... *G01R 19/0092* (2013.01); *G01R 31/2608* (2013.01); *G01R 31/2621* (2013.01); *G01R 31/2639* (2013.01); *G01R 31/40* (2013.01)

(58) Field of Classification Search
 CPC ........ G01R 19/00; G01R 31/26; G01R 31/40; G01R 19/0092; G01R 31/2639; G01R 1/07342; G01R 1/06772; G01R 31/2886; G01R 3/00; G01R 31/2889
 See application file for complete search history.

(56) References Cited

U.S. PATENT DOCUMENTS

| | | | | |
|---|---|---|---|---|
| 5,347,166 A | * | 9/1994 | Schauder | H02M 1/096 307/112 |
| 5,544,035 A | * | 8/1996 | Beriger | H02M 7/003 363/132 |
| 5,777,506 A | * | 7/1998 | Kurachi | H03K 17/08124 327/438 |
| 5,828,539 A | * | 10/1998 | Bijlenga | H03K 17/163 361/100 |
| 6,208,185 B1 | * | 3/2001 | John | H03K 17/0406 327/170 |
| 6,917,188 B2 | * | 7/2005 | Kernahan | H02M 3/157 323/211 |
| 6,954,368 B1 | * | 10/2005 | Francoeur | H02M 7/003 361/763 |
| 2003/0102845 A1 | * | 6/2003 | Aker | H02J 7/0042 320/139 |
| 2004/0113268 A1 | * | 6/2004 | Shirakawa | H01L 23/5383 257/724 |
| 2009/0063085 A1 | * | 3/2009 | Conner | G01R 31/31924 702/117 |
| 2012/0032709 A1 | * | 2/2012 | Saotome | H03K 17/04206 327/109 |
| 2012/0081139 A1 | * | 4/2012 | Yoshida | G01R 31/2608 324/750.16 |

* cited by examiner

*Primary Examiner* — Jermele M Hollington
*Assistant Examiner* — Suresh K Rajaputra
(74) *Attorney, Agent, or Firm* — Murphy, Bilak & Homiller, PLLC (57) ABSTRACT

Hardware test systems are provided that have an electrical test loop with a minimum length of less than 200 mm, a maximum di/dt capacity of at least 1500 A/μs and a minimum parasitic inductance of less than 100 nH. The hardware tests systems can be used for commutation measurement or other test applications requiring low stray inductance.

21 Claims, 13 Drawing Sheets

HIGH DI/DT CAPACITY MEASUREMENT HARDWARE

TECHNICAL FIELD

The instant application relates to commutation measurement hardware, and more particularly to high di/dt commutation measurement hardware.

BACKGROUND

The source of a power MOSFET (metal oxide semiconductor field effect transistor) is typically shorted to the oppositely doped body using the source metallization to suppress parasitic NPN action in the transistor. An integrated body diode connected anti-parallel with the transistor is formed by shorting the source to the body. During commutation from forward conduction to the off-state, the diode displays a transient reverse current that far exceeds the maximum rated blocking current. This reverse current is called reverse recovery current and its time integral is the recovered charge (Qrr).

Commutation measurement is an important application measurement for power MOSFETs and involves measuring the following parameters related to the reverse recovery characteristics of a transistor: reverse recovery charge; reverse recovery time; rising time; falling time; maximum reverse recovery current; maximum reverse recovery voltage; voltage rising speed (dv/dt); and softness. The test hardware must have very high current rising (di/dt) capability to effectively measure commutation. The di/dt capability of conventional commutation measurement test hardware systems is about 700 A/µs or less which is often not sufficient to meet customer requirements at different temperatures under high di/dt.

SUMMARY

According to an embodiment of a hardware test system, the system includes a board comprising an insulating member and electrically conductive traces insulated from one another by the insulating member, and an energy storage system attached to the board. The energy storage system has first and second terminals at different polarities, the first terminal being connected to a first one of the traces and the second terminal being connected to a second one of the traces. The hardware test system further comprises a control unit attached to the board and electrically connected to the first trace, a DUT (device under test) input terminal attached to the same side of the board as the control unit and electrically connected to the control unit, and a DUT output terminal attached to the same side of the board as the control unit and electrically connected to the second trace. An electrical pathway from the first terminal to the second terminal of the energy storage system through the first trace, the control unit, the DUT and the second trace has a minimum length of less than 200 mm, a maximum di/dt capacity of at least 1500 A/µs and a minimum parasitic inductance of less than 100 nH.

According to another embodiment of a hardware test system, the system comprises a first board comprising a first electrically conductive sheet, an insulating sheet on the first electrically conductive sheet and a second electrically conductive sheet on the insulating sheet, the insulating sheet electrically insulating the first and second electrically conductive sheets from one another, and an energy storage system comprising one or more first cells disposed below the first electrically conductive sheet and one or more second cells disposed above the second electrically conductive sheet. Each of the first cells has a first terminal connected to the first electrically conductive sheet and a second terminal connected to the second electrically conductive sheet. Each of the second cells has a first terminal connected to the first electrically conductive sheet and a second terminal connected to the second electrically conductive sheet. The first terminals of the first and second cells are at a different polarity than the second terminals of the first and second cells. The hardware test system further comprises a second board disposed on the second electrically conductive sheet. The second board comprises a first terminal connected to the first electrically conductive sheet, a second terminal connected to the second electrically conductive sheet, a DUT interface and a control unit operable to control operation of a DUT connected to the DUT interface. An electrical pathway from the first terminals of the first and second cells to the second terminals of the first and second cells through the first electrically conductive sheet, the control unit, the DUT and the second electrically conductive sheet has a minimum length of less than 100 mm, a maximum di/dt capacity of at least 2000 A/µs and a minimum parasitic inductance of less than 50 nH.

Those skilled in the art will recognize additional features and advantages upon reading the following detailed description, and upon viewing the accompanying drawings.

BRIEF DESCRIPTION OF THE DRAWINGS

The elements of the drawings are not necessarily to scale relative to each other. Like reference numerals designate corresponding similar parts. The features of the various illustrated embodiments can be combined unless they exclude each other. Embodiments are depicted in the drawings and are detailed in the description which follows.

FIG. 6, which includes

DETAILED DESCRIPTION

According to embodiments described herein, current commutation hardware test systems are provided that have an electrical test loop with a minimum length of less than 200 mm, a maximum di/dt capacity of at least 1500 A/µs and a minimum parasitic inductance of less than 100 nH. The hardware tests systems described herein can be used for high di/dt commutation measurement or other test applications requiring low stray inductance.

Figure 1:
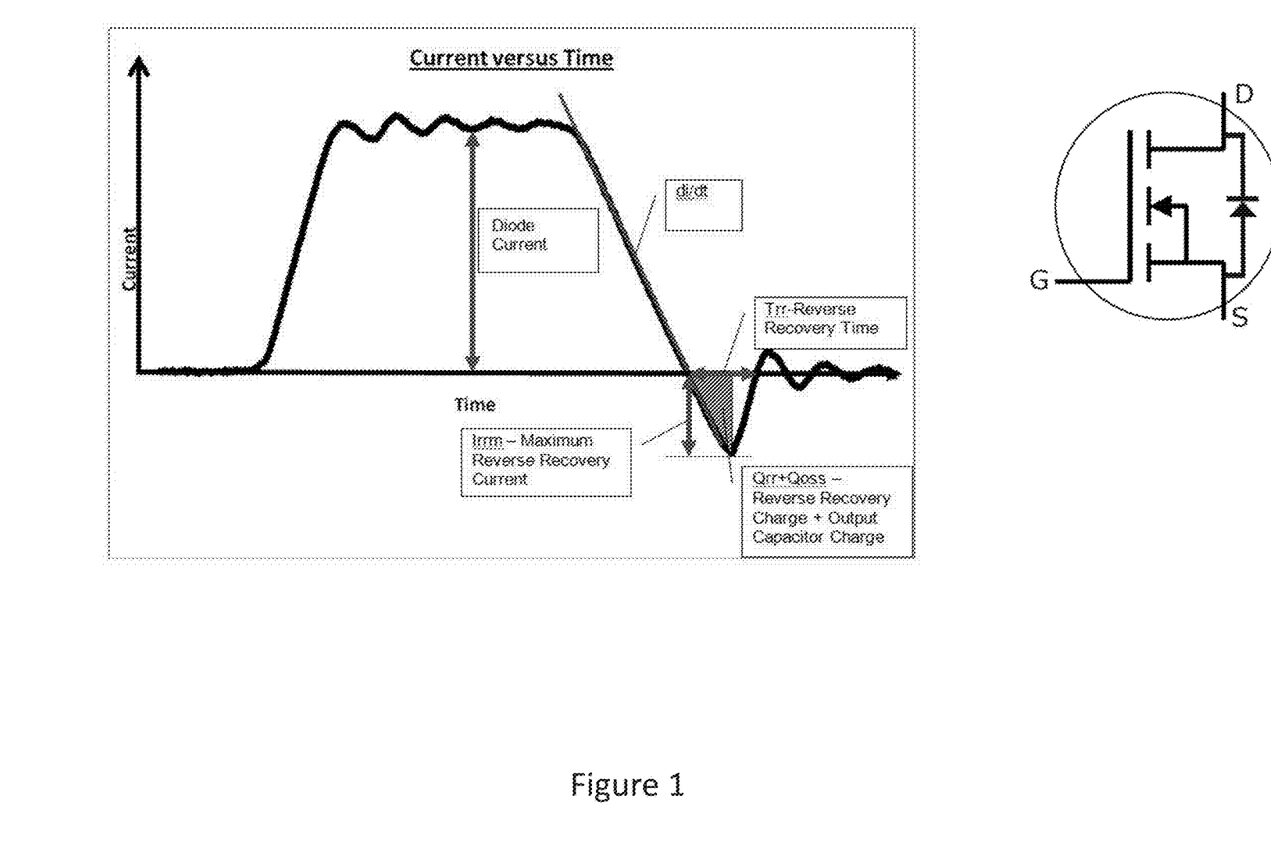
FIG. 1 illustrates a current profile for a power MOSFET.

FIG. 1 illustrates a current profile for the exemplary power MOSFET shown on the right-hand side of FIG. 1. An integrated body diode is connected anti-parallel with the transistor between the source (S) and drain (D). The current plotted in FIG. 1 is for the body diode and can be characterized by changing diode current (di/dt), reverse recovery charge (Qrr), output capacitor charge (Qoss), reverse recovery time (Trr), rising time, falling time, maximum reverse recovery current (Irrm), maximum reverse recovery voltage, voltage rising speed (dv/dt), and softness.

Figure 2:
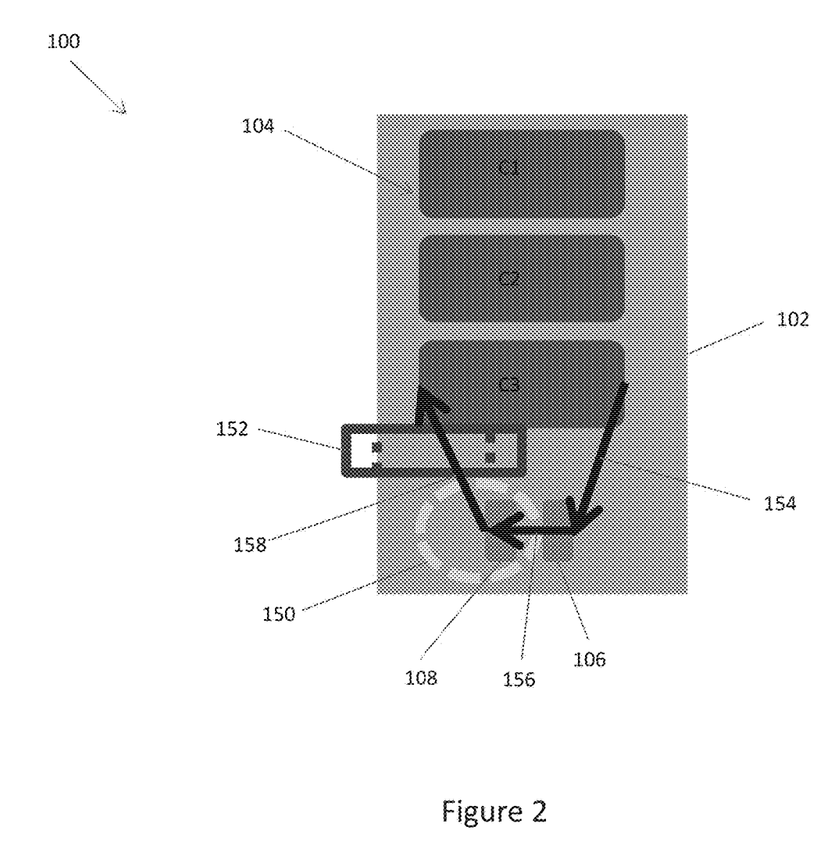
FIG. 2 illustrates a block diagram of an embodiment of a hardware test system for measuring current commutation of a power transistor.

FIG. 2 illustrates a block diagram of an embodiment of a hardware test system 100 for measuring current commutation of a power transistor such as a power MOSFET, IGBT (insulated gate bipolar transistor), etc. The hardware test system 100 includes a board 102 such as a PCB (printed circuit board), an energy storage system 104, a control unit 106, and a DUT (device under test) interface 108.

Figure 3:
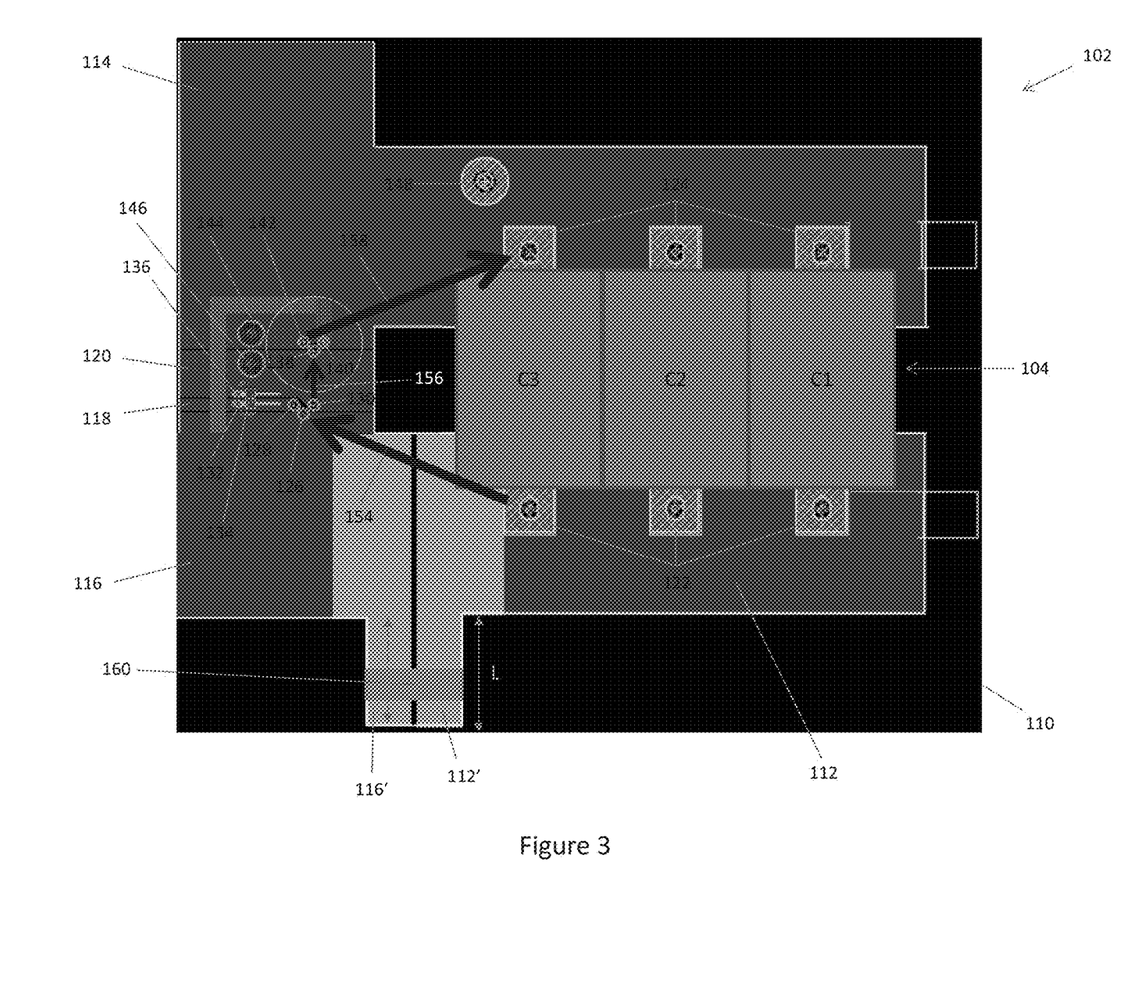
FIG. 3 illustrates a more detailed view of a test board included in the hardware test system of FIG. 2.

FIG. 3 illustrates the board 102 in more detail. The board 102 comprises an insulating member 110 and electrically conductive traces 112, 114, 116, 118, 120 insulated from one another by the insulating member 110. The energy storage system 104 is attached to the board 102 and has first and second terminals 122, 124 at different polarities (+, −). The first terminal 122 of the energy storage system 104 is connected to a first one 112 of the traces and the second terminal 124 of the energy storage system 104 is connected to a second one 114 of the traces. In one embodiment, the energy storage system 104 includes a plurality of energy storage cells (C1, C2, C3) such as capacitors.

The control unit 106 is attached to the same side of the board 102 as the energy storage system 104 and electrically connected to the first terminal 122 of the energy storage system 104 via the first trace 112 and an optional third trace 116. The control unit 106 controls operation of the DUT. In one embodiment, the control unit 106 includes a MOSFET or other type of three-terminal transistor for controlling the DUT current. According to this embodiment, an interface for the control unit 106 is realized by three control unit terminals 126, 128, 130 attached to the board 102 as shown in FIG. 3. The first control unit terminal 126 is electrically coupled to the first terminal 122 of the energy storage 104 via the first trace 112 and the optional third trace 116. The second control unit terminal 128 is connected to a different trace 118 on the board 102 which in turn is electrically coupled to one terminal 132 of a connector 134 for an external supply voltage. The third control unit terminal 130 is connected to another trace 120 on the board 102 which in turn is electrically coupled to the other terminal 136 of the external supply voltage connector 134.

In the case of a three-terminal power MOSFET DUT, the interface 108 for the DUT is realized by three DUT terminals 138, 140, 142 attached to the same side of the board 102 as the control unit 106. The drain (output) DUT terminal 138 is electrically connected to the third terminal 130 of the control unit interface via the corresponding board trace 120. The source DUT terminal 140 is electrically connected to ground by a trace on the opposite side of the board 102 as the control unit 106 and energy storage system 104. The gate (input) DUT terminal 142 is electrically connected to the second terminal 124 of the energy storage 104 via the second trace 114 of the board 102. The board 102 can include other terminals 144, 146, 148 e.g. for connecting to inductors, resistors, other passive and/or active components.

The board 102 can also include a temperature unit 150 attached to the same side of the board 102 as the control unit 106. The temperature unit 150 changes the temperature of the DUT connected to the DUT interface 108. This way, the DUT can be tested over a range of temperatures. Any standard temperature unit can be used.

The board 102 can further include a current meter 152 inductively coupled to the board trace 114 that connects the DUT output terminal to the second terminal 124 of the energy storage system 104. The current meter 152 measures current commutation of the DUT connected to the DUT interface 108 at a di/dt of at least 1500 A/µs owing to the short electrical pathway from the first terminal 122 to the second terminal 124 of the energy storage system 104 through the board traces 112-120, the control unit 106 and the DUT. In one embodiment, the current meter 152 is shaped like a ring and has a magnetic core. According to this embodiment, the board trace 114 to be monitored is inserted through the hole in the current meter 152. Current is measured by closing the circuit under control by the control unit 106.

The electrical pathway from the first terminal 122 to the second terminal 124 of the energy storage system 104 through the board traces 112-120, the control unit 106 and the DUT is indicated in FIGS. 2 and 3 by a series of arrows. Due to the close arrangement of the control unit 106 and the DUT to the energy storage system 104 on the same side of the board 102, the electrical pathway has a minimum length of less than 200 mm, a maximum di/dt capacity of at least 1500 A/µs and a minimum parasitic inductance of less than 100 nH.

In one embodiment, the leg 154 of the electrical pathway from the first terminal 122 of the energy storage system 104 to the control unit 106 is between about 40% to 50% of the total length of the electrical pathway, the leg 156 of the electrical pathway from the control unit 106 to the DUT interface 108 is between about 10% to 15% of the total length of the electrical pathway, and the leg 158 of the electrical pathway from the DUT interface 108 to the second terminal 124 of the energy storage system 104 is between about 35% to 45% of the total length of the electrical pathway. In one embodiment, the minimum length of the electrical pathway is 150 mm or less, the maximum di/dt capacity of the electrical pathway is 1900 A/µs or greater, and the minimum parasitic inductance of the electrical pathway is 55 nH or less. Such a configuration allows for very high di/dt commutation measurement.

FIG. 3 shows an embodiment whereby the actual length of the electrical pathway from the first terminal 122 to the second terminal 124 of the energy storage system 104 through the board traces 112-120, the control unit 106 and the DUT can be adjusted. According to this embodiment, the first terminal 122 of the energy storage system 104 is connected to first board trace 112, the second terminal 124 of the energy storage system 104 is connected to a second board trace 114 and the control unit 106 is connected to a third board trace 116. The first and third traces 112, 116 each have an extension 112', 116' spaced apart from one another and extending outwardly in parallel with one another from the first and third traces 112, 116 as shown in FIG. 3. An electrically conductive bridge 160 such as a metal strip connects the first and the third traces 112, 116 at a region along the length (L) of the extensions 112', 116' of the first and third traces 112, 116. Placement of the bridge 160 along the length of the extensions 112', 116' of the first and third traces 112, 116 can be adjusted as indicated by the dashed line in FIG. 3 to modify the length, maximum di/dt capacity and minimum parasitic inductance of the electrical pathway.

Figure 4:
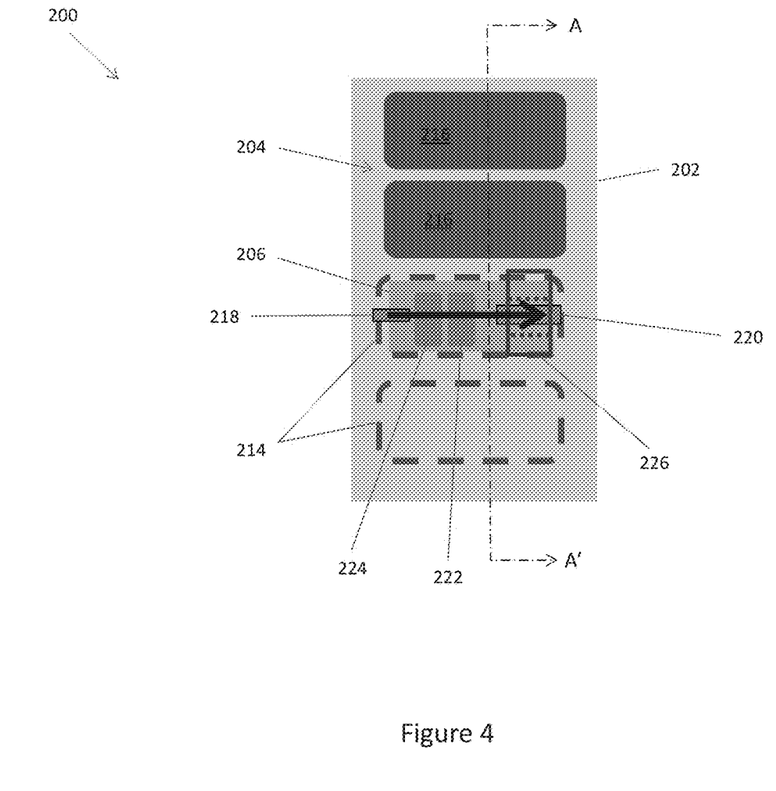
FIG. 4 illustrates a block diagram of another embodiment of a hardware test system for measuring current commutation of a power transistor.
Figure 5:
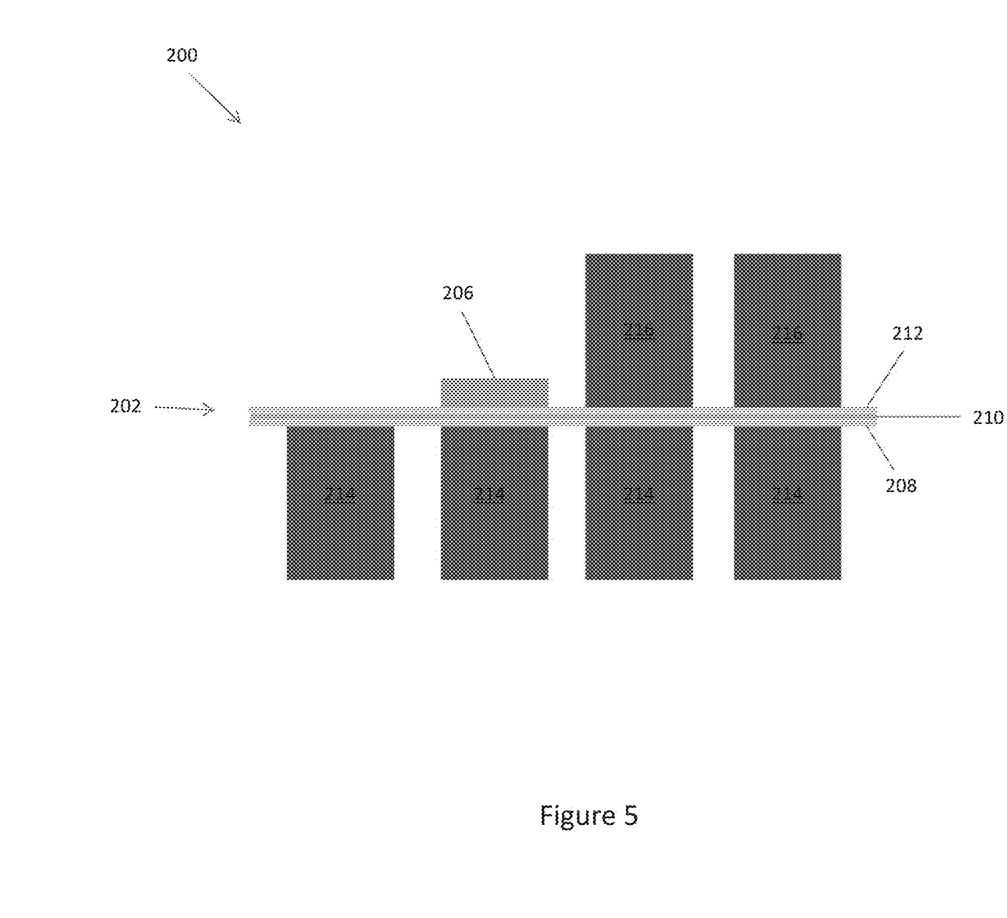
FIG. 5 illustrates a cross-sectional view of the hardware test system of FIG. 4 along the line labeled A-A'.

FIG. 4 illustrates a block diagram of another embodiment of a hardware test system 200 for measuring current commutation of a power transistor such as a power MOSFET, IGBT (insulated gate bipolar transistor), etc. The electrical test loop (pathway) of the hardware test system 200 has a minimum length of less than 200 mm, a maximum di/dt capacity of at least 1500 A/µs and a minimum parasitic inductance of less than 100 nH according to this embodiment. FIG. 5 shows a cross-sectional view of the hardware test system 200 along the line labeled A-A' in FIG. 4.

According to this embodiment, the hardware test system 200 includes a first board 202, an energy storage system 204 and a second board 206. The first board 202 comprises a first electrically conductive sheet 208 such as a copper or aluminum sheet, an insulating sheet 210 on the first electrically conductive sheet 208 and a second electrically conductive sheet 212 such as a copper or aluminum sheet on the insulating sheet 210. The insulating sheet 210 electrically insulates the first and second electrically conductive sheets 208, 212 from one another. The first and the second electrically conductive sheets 208, 212 can be aligned one above the other and the energy storage system 204 can charge the first and the second electrically conductive sheets 208, 212 to opposite polarities to cancel EM (electromagnetic) energy and reduce stray inductance.

The energy storage system 204 comprises one or more first energy storage cells 214 disposed below the first electrically conductive sheet 208 and one or more second energy storage cells 216 disposed above the second electrically conductive sheet 212. Each of the first cells 214 has a first terminal connected to the first electrically conductive sheet 208 and a second terminal connected to the second electrically conductive sheet 212. Each of the second cells 216 similarly has a first terminal connected to the first electrically conductive sheet 208 and a second terminal connected to the second electrically conductive sheet 212. The first terminals of the first and second cells 214, 216 are at a different polarity than the second terminals of the cells 214, 216. The terminals of the cells 214, 216 are not shown in FIGS. 4 and 5 for ease of illustration, but are shown in FIG. 6 which is described later herein.

The second board 206 of the hardware test system 200 is disposed on the second electrically conductive sheet 212 of the first board 202. In one embodiment, the second board 206 is centered between the first and second cells 214, 216 of the energy storage system 204. The second board 206 comprises a first terminal 218 connected to the first electrically conductive sheet 208, a second terminal 220 connected to the second electrically conductive sheet 212, a DUT (device under test) interface 222, and a control unit 224 operable to control operation of a DUT connected to the DUT interface 222. The connections between the terminals 218, 220 of the second board 206 and the electrically conductive sheets 208, 212 of the first board 202 are shown in greater detail in FIG. 6.

An electrical pathway from the first terminals of the first and second energy storage cells 214, 216 to the second terminals of the first and second cells 214, 216 is realized through the first electrically conductive sheet 208, the control unit 224, the DUT and the second electrically conductive sheet 212 as indicated by the solid arrow in FIG. 4. Owing to the stacked configuration of the first and second boards 202, 206, the electrical pathway has a minimum length of less than 100 mm, a maximum di/dt capacity of at least 2000 A/µs and a minimum parasitic inductance of less than 50 nH. In some embodiments, the minimum length of the electrical pathway is 80 mm or less, the maximum di/dt capacity of the electrical pathway is 2800 A/µs or greater and/or the minimum parasitic inductance of the electrical pathway is 40 nH or less. The hardware test system 200 can also include a current meter 226 inductively coupled to the first or second electrically conductive sheets 208, 212 of the first board 202 for measuring current commutation of the DUT connected to the DUT interface 222 at a di/dt of at least 1500 A/µs. In one embodiment, the current meter 226 is shaped like a ring and has a magnetic core. According to this embodiment, the electrically conductive sheet 208/212 inductively coupled to the current meter 226 is shaped for insertion through a hole in the current meter 226. Current is measured by closing the circuit under control by the control unit 224.

FIG. 6, which includes FIGS. 6A through 6G, illustrates an embodiment of a method of manufacturing the hardware test system 200 shown in FIGS. 4 and 5.

Figure 6A:
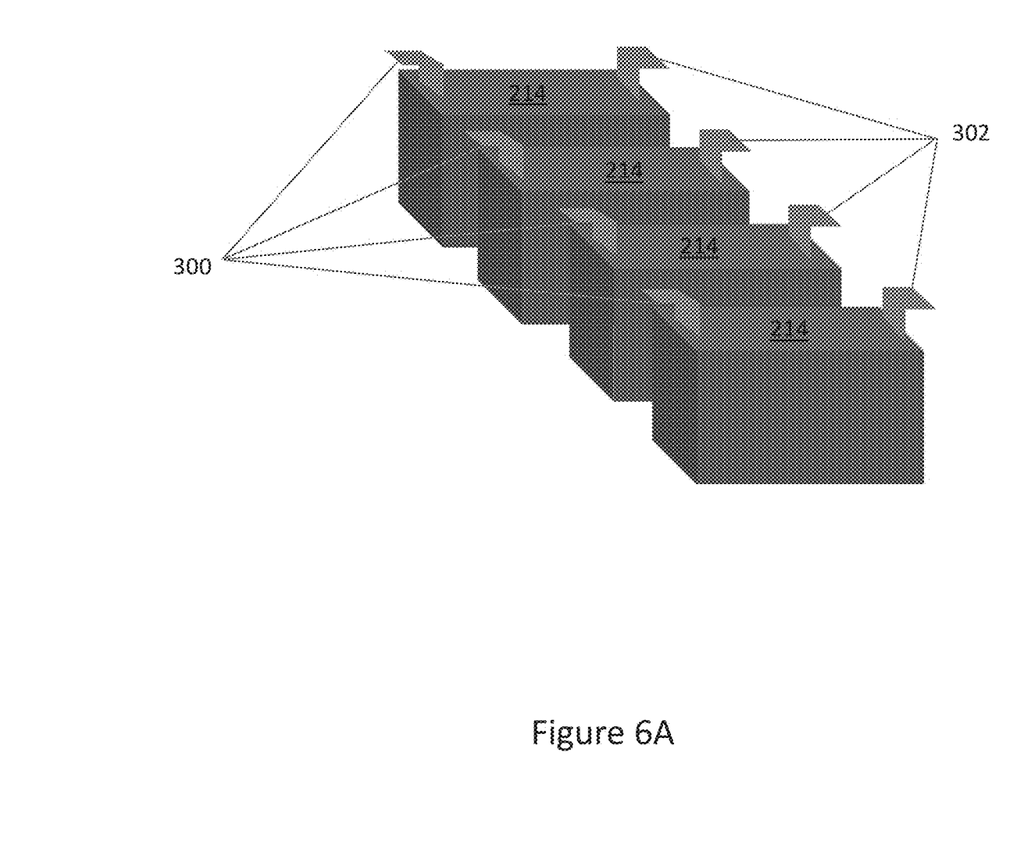
FIGS. 6A through 6G, illustrates an embodiment of a method of a manufacturing the hardware test system of FIGS. 4 and 5.

FIG. 6A shows the first cells 214 of the energy storage system 204. Each of the first cells 214 has a first terminal 300 and a second terminal 302 at opposite polarities.

Figure 6B:
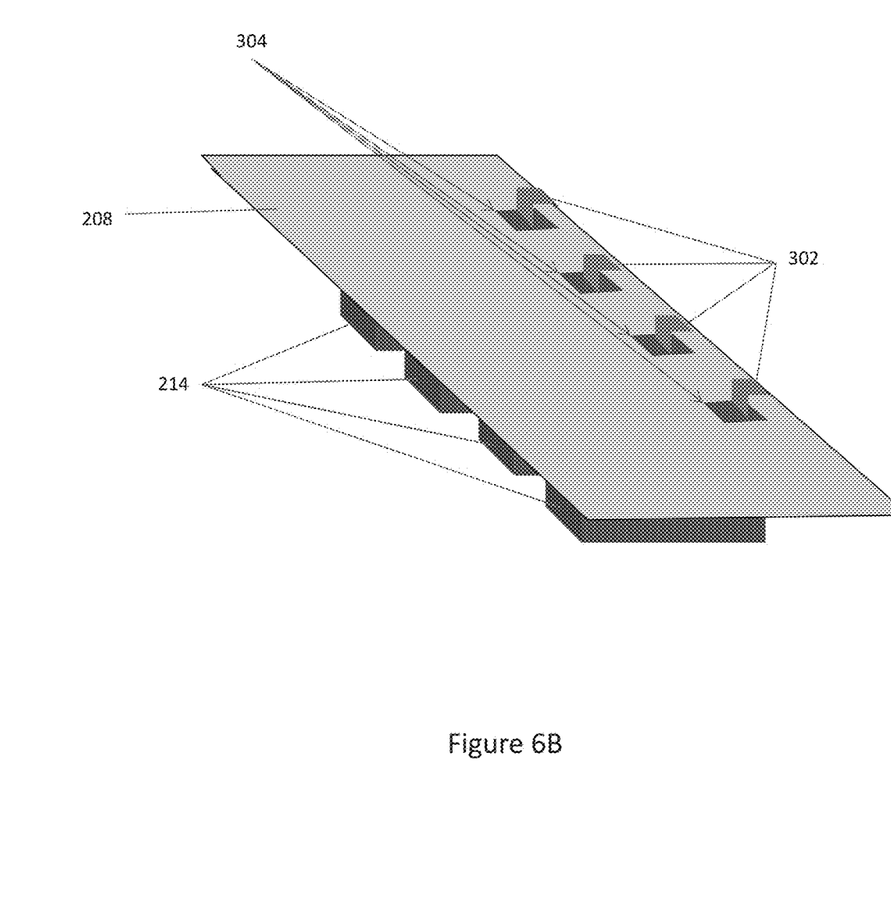

FIG. 6B shows the first electrically conductive sheet 208 of the first board 202 of the test system 200 disposed above the first cells 214 of the energy storage system 204. The first terminal 300 of each first energy storage cell 214 is connected to the underside of the first electrically conductive sheet 208, i.e. the side of the first electrically conductive sheet 208 facing the first cells 214. The first electrically conductive sheet 208 has a plurality of openings 304 through which the second terminals 302 of the first cells 214 vertically pass without contacting the first electrically conductive sheet 208, so that the second terminals 302 of the first cells 214 are electrically insulated from the first electrically conductive sheet 208 of the first board 202.

Figure 6C:
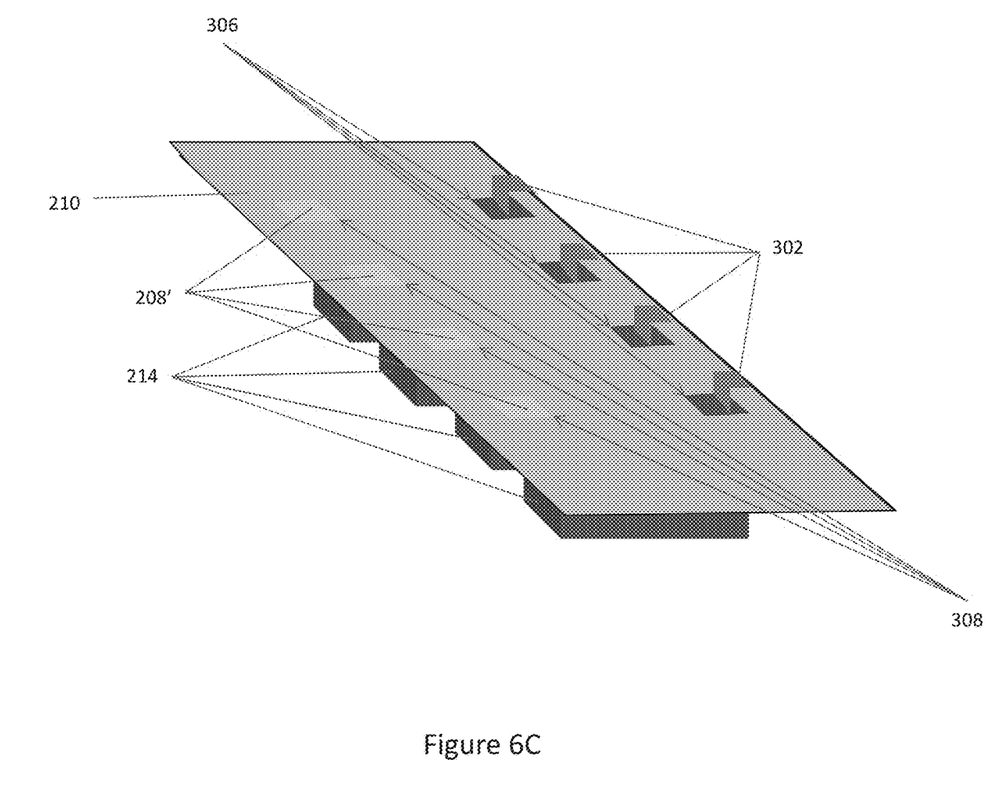

FIG. 6C shows the insulating sheet 210 of the first board 202 disposed on the first electrically conductive sheet 208. The insulating sheet 210 has a first plurality of openings 306 aligned over the openings 304 in the first electrically conductive sheet 208 and through which the second terminals 302 of the first energy storage cells 214 vertically pass unobstructed. The insulating sheet 210 also has a second plurality of openings 308 spaced apart from the first openings 306 for exposing part 208' of the underlying first electrically conductive sheet 208.

Figure 6D:
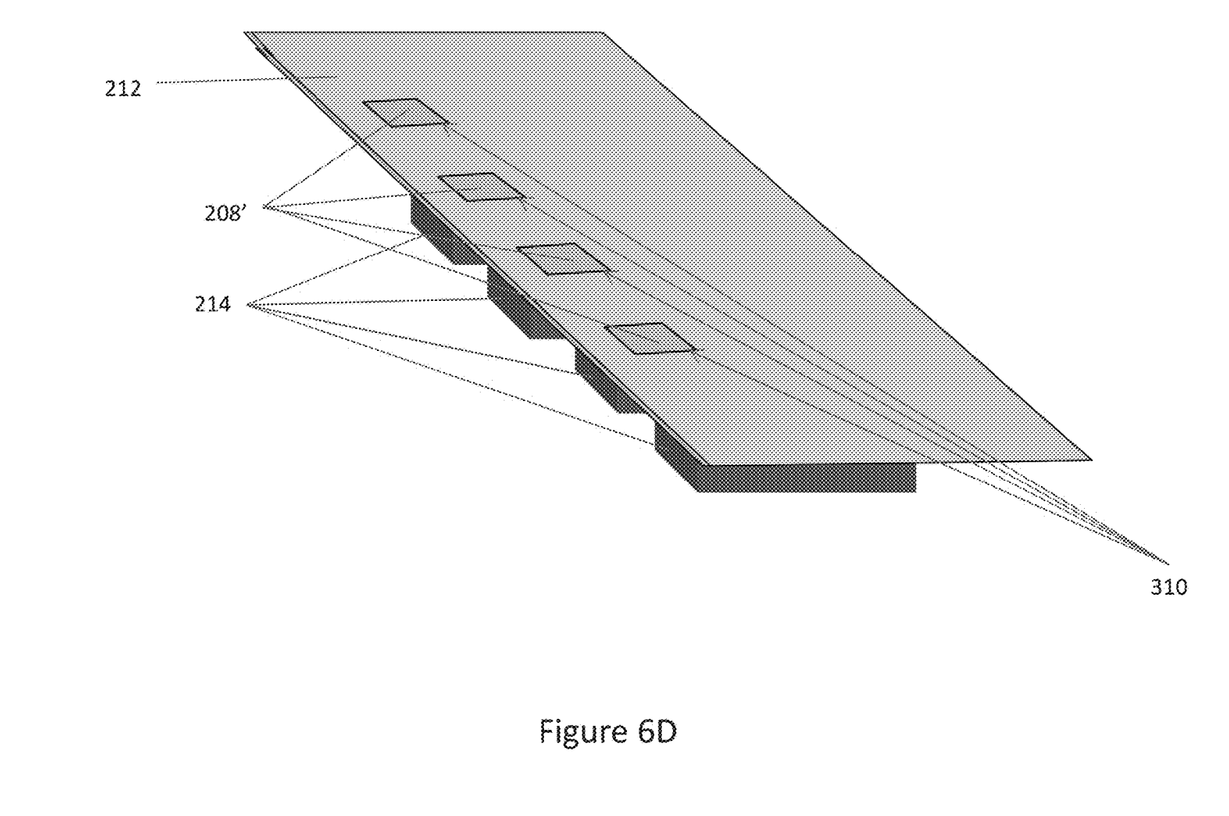

FIG. 6D shows the second electrically conductive sheet 212 of the first board 202 disposed on the insulating sheet 210. The second terminals 302 of the first energy storage cells 214 are connected to the underside of the second electrically conductive sheet 212 i.e. the side facing the first cells 214, through the openings 304 in the first electrically conductive sheet 208 and the first openings 306 in the insulating sheet 210. The second electrically conductive sheet 212 has a plurality of openings 310 aligned over the second openings 308 in the underlying insulating sheet 210, so that the part 208' of the first electrically conductive sheet 208 exposed by the second openings 308 in the insulating sheet 210 remains exposed with the second electrically conductive sheet 212 on the insulating sheet 210.

Figure 6E:
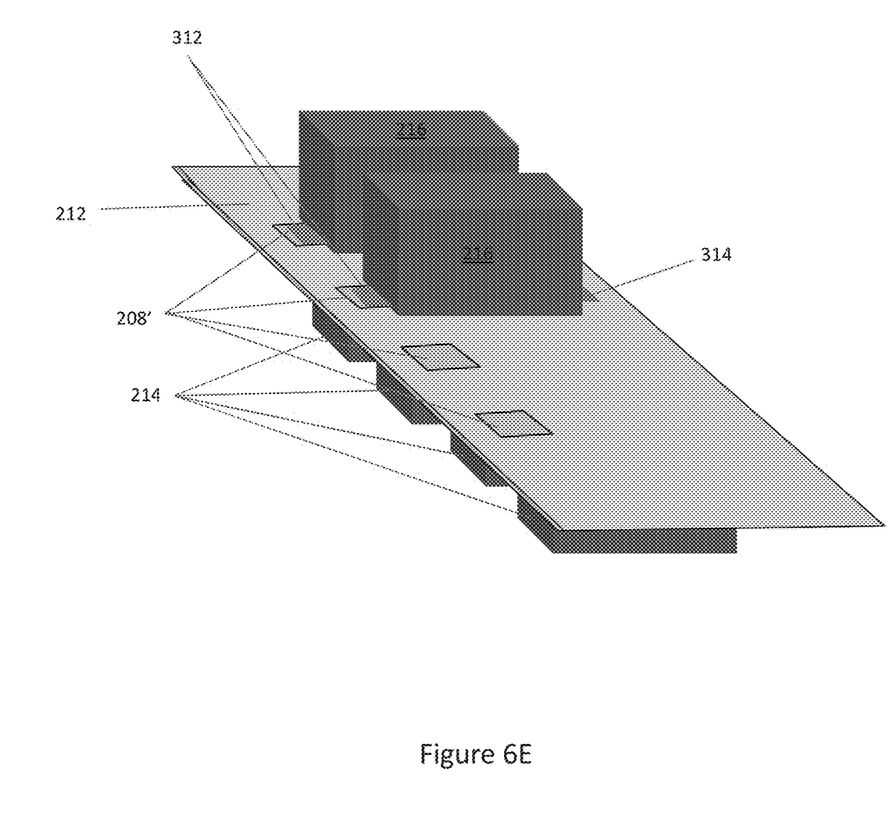

FIG. 6E shows the second cells 216 of the energy storage system 204 disposed on the second electrically conductive sheet 212 of the first board 202. The first terminals 312 of the second energy storage cells 216 are connected to the first electrically conductive sheet 208 through the openings 310 in the second electrically conductive sheet 212 and the second openings 308 in the insulating sheet 210. The second terminals 314 of the second energy storage cells 216 are connected to the top side of the second electrically conductive sheet 212 i.e. the side facing the second cells 216. With this configuration of the first board 202 and the energy storage system 204, the first and second cells 214, 216 of the energy storage system 204 are coupled in parallel.

Figure 6F:
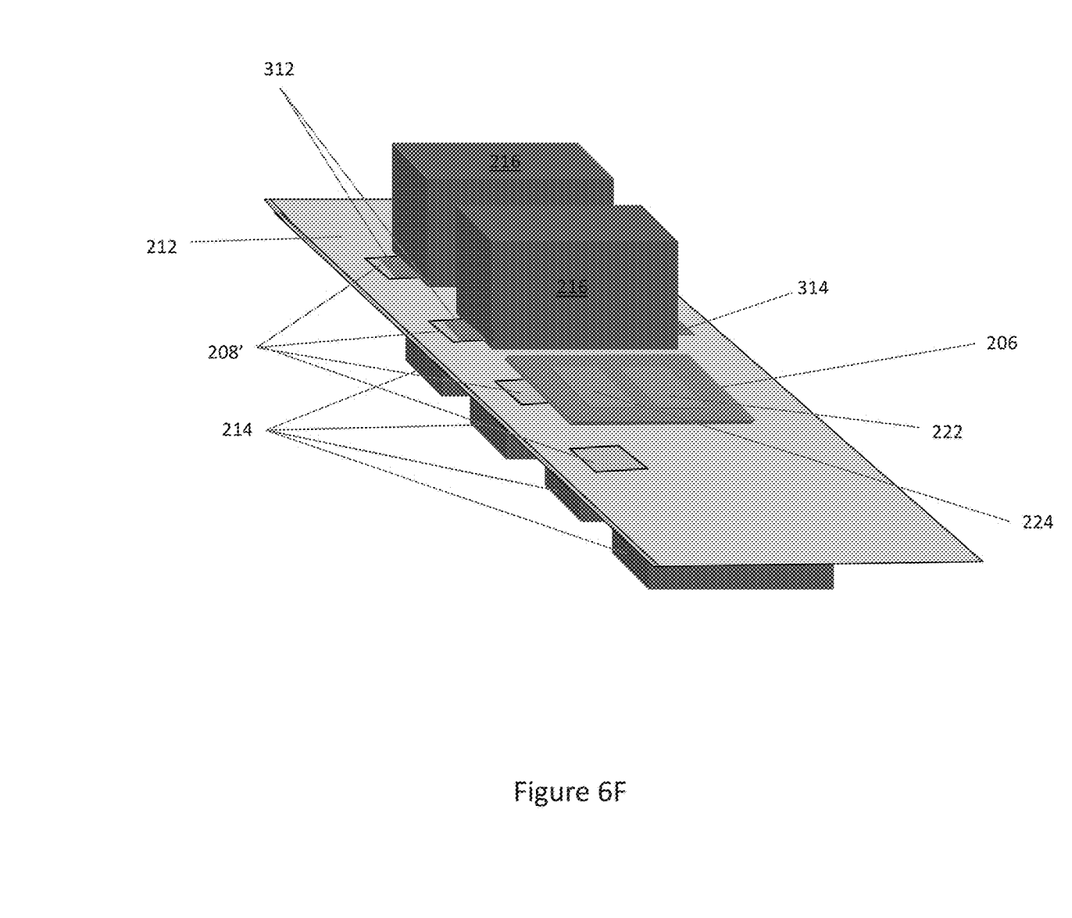

FIG. 6F shows the second board 206 disposed on the second electrically conductive sheet 212 of the first board 202. In one embodiment, the second board 206 is a PCB (printed circuit board) or similar type of laminate board. For example, the second board 206 can be single-sided (e.g. one copper layer), double-sided (e.g. two copper layers) or multi-layer and conductors on different layers can be connected with plated-through holes or vias. At least some of the conductors on the bottom side of the second board 206 i.e. the side facing the first board 202 form terminals (out of view in FIG. 6F). A first one of the terminals is connected to the first electrically conductive sheet 208 through one or more of the openings 310 in the second electrically conductive sheet 212 and the second openings 308 in the insulating sheet 310. A second one of the terminals is connected to the side of the second electrically conductive sheet 212 facing the second board 206. The second board 206 also includes a DUT (device under test) interface 222 and a control unit 224 operable to control operation of a DUT connected to the DUT interface 22. A current sensor is not shown in FIG. 6F for ease of illustration.

Figure 6G:
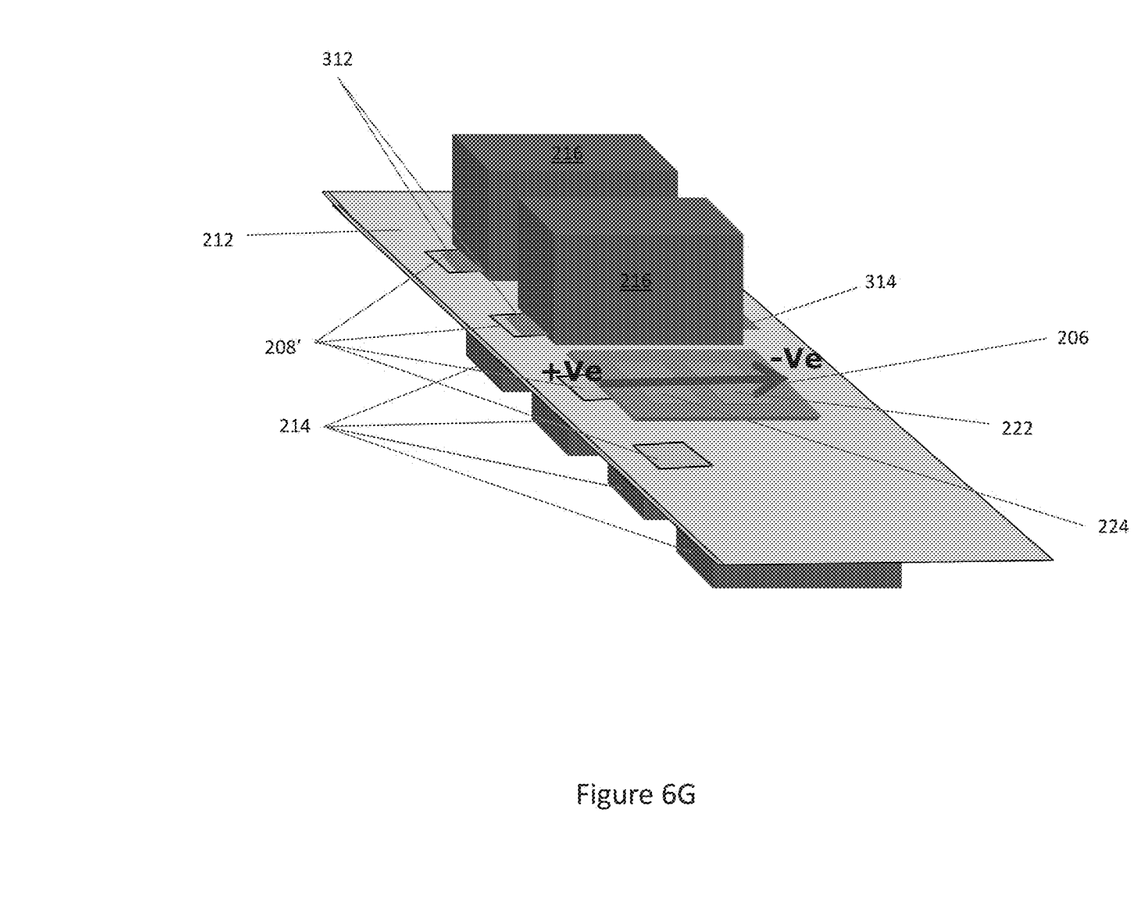

FIG. 6G shows the electrical pathway from the first terminals 300, 312 of the first and second energy storage cells 214, 216 to the second terminals 302, 314 of the cells 214, 216. The electrical pathway is is realized through the first electrically conductive sheet 208, the control unit 224, the DUT and the second electrically conductive sheet 212 as indicated by the solid arrow shown in FIG. 6G. Owing to the stacked configuration of the first and second boards 202, 206, the electrical pathway has a minimum length of less than 100 mm, a maximum di/dt capacity of at least 2000 A/µs and a minimum parasitic inductance of less than 50 nH. The terminals 300, 312 of the energy storage system 204 are at opposite polarities (+Ve, −Ve) to enable current commutation testing of the DUT connected to the DUT interface 222.

Figure 7:
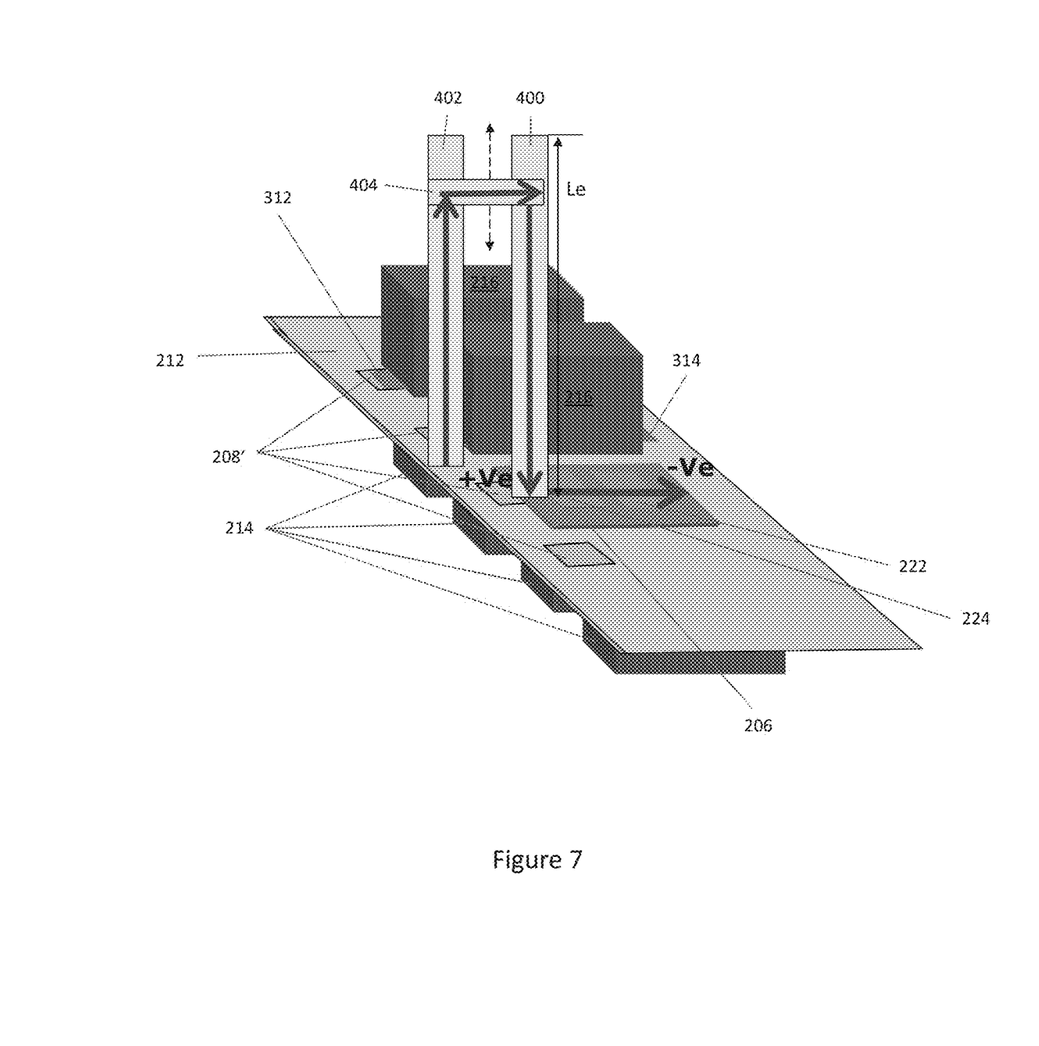
FIG. 7 illustrates an alternative embodiment of the hardware test system shown in FIGS. 4 and 5.

FIG. 7 illustrates an alternative embodiment of the hardware test system 200 shown in FIGS. 4 and 5. According to this embodiment, first and second sections 400, 402 are spaced apart from one another and extend outwardly in parallel with one another from the second electrically conductive sheet 212. The first terminal 218 of the second board 204 is connected to one of the first and second extensions 400, 402 and the other extension is connected to the second electrically conductive sheet 212. An electrically conductive bridge 404 connects the first and second extensions 400, 402 at a region along the length (Le) of the extensions 400, 402. This way, the electrical pathway of the hardware test system also includes the first and second extensions 400, 402 and the bridge 404 that connects the extensions 400, 402 as indicated by the solid arrows shown in FIG. 7. Placement of the bridge 404 along the length (Le) of the first and second extensions 400, 402 can be adjusted as indicated by the dashed line shown in FIG. 7, to modify the length, maximum di/dt capacity and minimum parasitic inductance of the electrical pathway of the hardware test system.

Spatially relative terms such as "under", "below", "lower", "over", "upper" and the like, are used for ease of description to explain the positioning of one element relative to a second element. These terms are intended to encompass different orientations of the device in addition to different orientations than those depicted in the figures. Further, terms such as "first", "second", and the like, are also used to describe various elements, regions, sections, etc. and are also not intended to be limiting. Like terms refer to like elements throughout the description.

As used herein, the terms "having", "containing", "including", "comprising" and the like are open-ended terms that indicate the presence of stated elements or features, but do not preclude additional elements or features. The articles "a", "an" and "the" are intended to include the plural as well as the singular, unless the context clearly indicates otherwise.

With the above range of variations and applications in mind, it should be understood that the present invention is not limited by the foregoing description, nor is it limited by the accompanying drawings. Instead, the present invention is limited only by the following claims and their legal equivalents.

What is claimed is:

1. A hardware test system, comprising:
a board comprising an insulating member and electrically conductive traces insulated from one another by the insulating member;
an energy storage system attached to the board, the energy storage system having first and second terminals at different polarities, the first terminal being connected to a first one of the traces and the second terminal being connected to a second one of the traces;
a control unit attached to the board and electrically connected to the first trace;
a DUT (device under test) input terminal attached to the same side of the board as the control unit and electrically connected to the control unit;
a DUT output terminal attached to the same side of the board as the control unit and electrically connected to the second trace; and
an electrical pathway from the first terminal to the second terminal of the energy storage system through the first trace, the control unit, the DUT and the second trace, the electrical pathway having a minimum length of less than 200 mm, a maximum di/dt capacity of at least 1500 A/µs and a minimum parasitic inductance of less than 100 nH.

2. The hardware test system of claim 1; wherein the minimum length of the electrical pathway is 150 mm or less.

3. The hardware test system of claim 1, wherein the maximum di/dt capacity of the electrical pathway is 1900 A/µs or greater.

4. The hardware test system of claim 1, wherein the minimum parasitic inductance of the electrical pathway is 55 nH or less.

5. The hardware test system of claim 1, wherein the control unit is connected to a third one of the traces and wherein the first and the third traces each have an extension spaced apart from one another and extending outwardly in parallel with one another from the first and third traces.

6. The hardware test system of claim 5, further comprising an electrically conductive bridge connecting the first and the third traces at a region along the length of the extensions of the first and third traces.

7. The hardware test system of claim 6, wherein placement of the bridge along the length of the extensions of the first and third traces is adjustable to modify the length, maximum di/dt capacity and minimum parasitic inductance of the electrical pathway.

8. The hardware test system of claim 1, further comprising a current meter inductively coupled to the second trace between the DUT output terminal and the energy storage system, the current meter operable to measure current commutation of a DUT connected to the DUT input and output terminals at a di/dt of at least 1500 A/µs.

9. The hardware test system of claim 1, further comprising a temperature unit attached to the same side of the board as the control unit and operable to change the temperature of a DUT connected to the DUT input and output terminals.

10. A hardware test system, comprising:
- a first board comprising a first electrically conductive sheet, an insulating sheet on the first electrically conductive sheet and a second electrically conductive sheet on the insulating sheet, the insulating sheet electrically insulating the first and second electrically conductive sheets from one another;
- an energy storage system comprising one or more first cells disposed below the first electrically conductive sheet and one or more second cells disposed above the second electrically conductive sheet, each of the first cells having a first terminal connected to the first electrically conductive sheet and a second terminal connected to the second electrically conductive sheet, each of the second cells having a first terminal connected to the first electrically conductive sheet and a second terminal connected to the second electrically conductive sheet, the first terminals of the first and second cells being at a different polarity than the second terminals of the first and second cells;
- a second board disposed on the second electrically conductive sheet and comprising:
  - a first terminal connected to the first electrically conductive sheet;
  - a second terminal connected to the second electrically conductive sheet;
  - a DUT (device under test) interface; and
  - a control unit operable to control operation of a DUT connected to the DUT interface; and
- an electrical pathway from the first terminals of the first and second cells to the second terminals of the first and second cells through the first electrically conductive sheet, the control unit, the DUT and the second electrically conductive sheet, the electrical pathway having a minimum length of less than 100 mm, a maximum di/dt capacity of at least 2000 A/µs and a minimum parasitic inductance of less than 50 nH.

11. The hardware test system of claim 10, wherein the minimum length of the electrical pathway is 80 mm or less.

12. The hardware test system of claim 10, wherein the maximum di/dt capacity of the electrical pathway is 2800 A/µs or greater.

13. The hardware test system of claim 10, wherein the minimum parasitic inductance of the electrical pathway is 40 or less.

14. The hardware test system of claim 10, further comprising first and second extensions spaced apart from one another and extending outwardly in parallel with one another from the second electrically conductive sheet, and wherein the first terminal of the second board is connected to one of the first and second extensions of the second electrically conductive sheet and the other extension is connected to the second electrically conductive sheet.

15. The hardware test system of claim 14, further comprising an electrically conductive bridge connecting the first and second extensions at a region along the length of the first and second extensions.

16. The hardware test system of claim 15, wherein placement of the bridge along the length of the first and second extensions is adjustable to modify the length; maximum di/dt capacity and minimum parasitic inductance of the electrical pathway.

17. The hardware test system of claim 10, further comprising a current meter inductively coupled to the first or the second electrically conductive sheet and operable to measure current commutation of the DUT connected to the DUT interface at a di/dt of at least 1500 A/µs.

18. The hardware test system of claim 10, wherein:
- the first electrically conductive sheet has a plurality of openings, the insulating sheet has a first plurality of openings aligned over the openings in the first electrically conductive sheet and a second plurality of openings spaced apart from the first plurality of openings, and the second electrically conductive sheet has a plurality of openings aligned over the second plurality of openings in the insulating sheet;
- the first terminals of the first cells are connected to a side of the first electrically conductive sheet facing the first cells;
- the second terminals of the first cells are connected to the second electrically conductive sheet through the openings in the first electrically conductive sheet and the first plurality of openings in the insulating sheet;
- the first terminals of the second cells are connected to the first electrically conductive sheet through the openings in the second electrically conductive sheet and the second plurality of openings in the insulating sheet; and
- the second terminals of the second cells are connected to a side of the second electrically conductive sheet facing the second cells.

19. The hardware test system of claim 10, wherein the first and the second electrically conductive sheets are charged to opposite polarities by the energy storage system and aligned one above the other to cancel EM (electromagnetic) energy and reduce stray inductance.

20. The hardware test system of Maim 10, wherein the second board is centered between the first and second cells of the energy storage system.

21. A hardware test system comprising an electrical test loop having a minimum length of less than 200 mm, a maximum di/dt capacity of at least 1500 A/µs and a minimum parasitic inductance of less than 100 nH.

* * * * *